United States Patent [19]

Shimizu et al.

[11] Patent Number: 5,311,011
[45] Date of Patent: May 10, 1994

[54] QUANTUM INTERFERENCE DEVICES AND METHODS FOR PROCESSING INTERFERENCE CURRENT

[75] Inventors: Akira Shimizu, Inagi; Masahiro Okuda, Sagamihara; Kazuhito Fujii, Atsugui, all of Japan

[73] Assignee: Canon Kabushiki Kaisha, Tokyo, Japan

[21] Appl. No.: 113,750

[22] Filed: Aug. 31, 1993

Related U.S. Application Data

[63] Continuation of Ser. No. 755,803, Sep. 6, 1991, abandoned.

[30] Foreign Application Priority Data

Sep. 13, 1990 [JP] Japan ................................. 2-242884

[51] Int. Cl.$^5$ ............................................. H01J 40/14
[52] U.S. Cl. ...................................... 250/214.1; 257/21
[58] Field of Search ...................... 250/214.1, 214 LS; 307/311; 257/21

[56] References Cited

U.S. PATENT DOCUMENTS

| | | | |
|---|---|---|---|
| 4,957,337 | 9/1990 | Ogawa et al. | 250/211 J |
| 5,130,766 | 7/1992 | Arimoto et al. | 357/16 |
| 5,157,467 | 10/1992 | Fujii | 357/16 |

OTHER PUBLICATIONS

"Proposed structure for large quantum interference effects" by S. Datta et al.; Applied Physics Letters; Feb. 17, 1986; vol. 48, No. 7; pp. 487-487.

"Control of Quantum Interference Current Through Exchange Interaction Between Coherent Electron Waves and Photo-Excited Virtual Carriers" by M. Yamanishi et al.; Japan Society of Applied Physics; Autumn 1989' 50th Lecture meeting; 27 p-Z-1, pp. 1030 (month unspecified).

*Primary Examiner*—David C. Nelms
*Attorney, Agent, or Firm*—Fitzpatrick, Cella, Harper & Scinto

[57] ABSTRACT

An electron wave is propagated through a plurality of quantum-structure paths of a quantum interference device and is branched into into plural electron waves that are confined in the quantum-structure paths. The electron waves from the quantum-structure paths are combined into a plurality of kinds of different energy level electron waves with varying magnitudes dependent on phase differences between the branched electron waves. The currents of the plurality of kinds of electron waves are detected and a non-fluctuating current is produced from the detected currents. The fluctuation of the electron wave current does not influence the non-fluctuating current and the phase differences among branched electron waves may be modulated by light, an electric field or a magnetic field applied to the branching portion of the device.

21 Claims, 8 Drawing Sheets

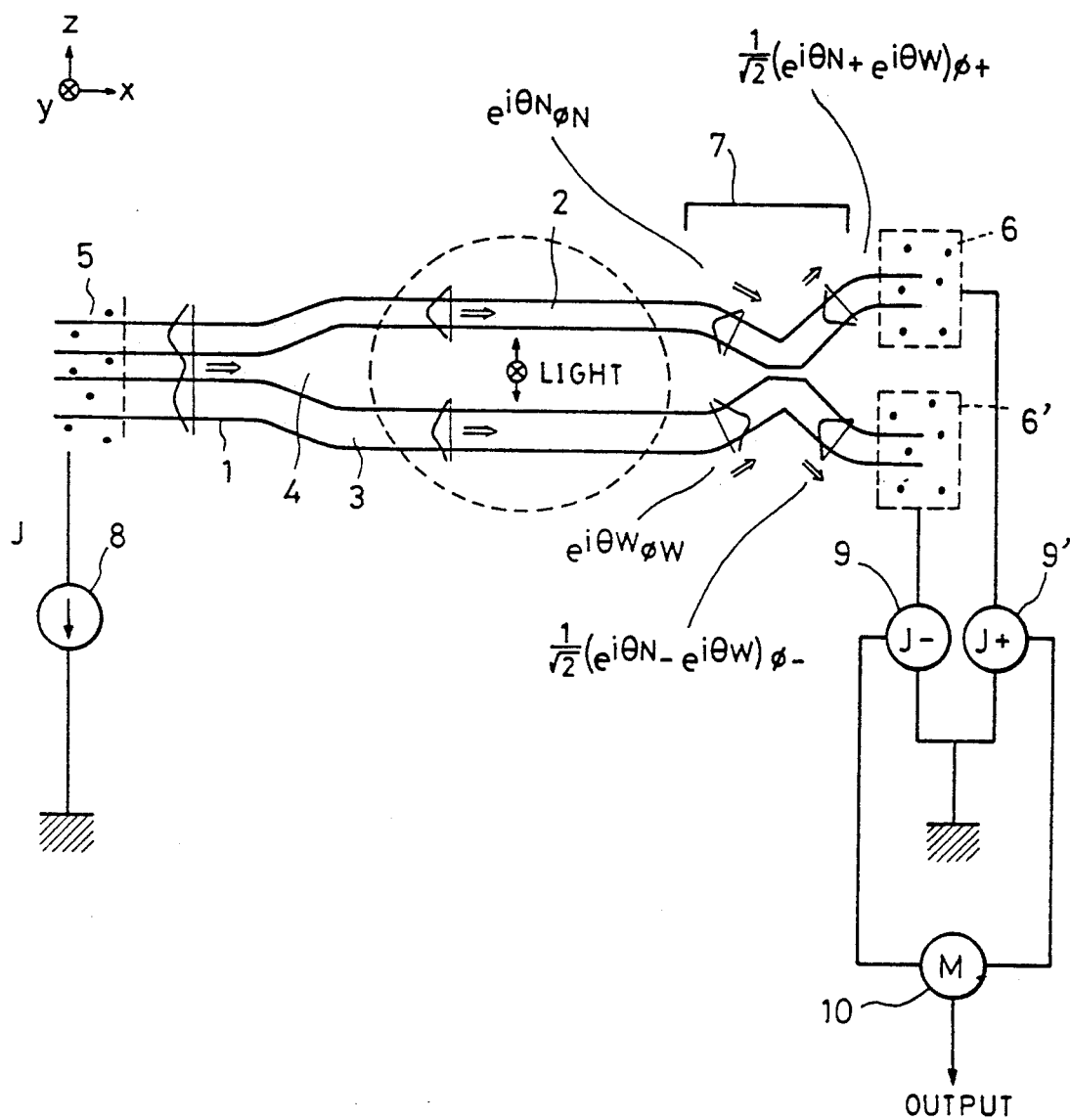

17. n-GaAs ($1\times10^{18} \sim 200\text{Å}$)
16. n-AlGaAs ($1\times10^{18} \sim 1000\text{Å}$)
15. i-AlGaAs $\sim 50\text{Å}$
14. i-AlAs $\sim 20\text{Å}$
13. i-GaAs $\sim 1000\text{Å}$
12. i-GaAs $5000\text{Å}$
11. GaAs SUBSTRATE

2DEG

BAND STRUCTURE

COMPONENT OF $2m\pi$

COMPONENT OF $(2m+1)\pi$

QUANTUM INTERFERENCE DEVICES AND METHODS FOR PROCESSING INTERFERENCE CURRENT

This application is a continuation of application Ser. No. 07/755,803 filed Sep. 6, 1991, now abandoned.

BACKGROUND OF THE INVENTION

1. Field of the Invention

This invention relates to interference of electron waves and processing interference current, and, more particularly to a quantum interference device (QID) and a method for converting signals carried by a magnetic field, an electric field, light or the like to electric signals by the Aharohov-Bohm effect (A-B effect), the optical Stark effect or the like.

2. Related Background Art

There has been developed a photodetector without photon absorption as shown in FIG. 1A which is a kind of QID. This device is operated as follows.

Electrons injected from a source electrode 110 disposed at the left side of FIG. 1A begin to propagate through paths or waveguides 111, 112 and 113 towards a drain electrode 114 formed at the right side with a wave function and an energy E indicated by $$e^{ikx}\phi_S(z)Y(y) \qquad (1)$$

$$E = (h^2/2m^*)k^2 + E_S + E_Y \qquad (2)$$

The paths 111, 112 and 113 are formed with a quantum well structure (QWS), a quantum line structure (QLS) or the like. In the formulae (1) and (2), $m^*$ is the effective mass of an electron moving in an x-direction, k is an angular wave number of the motion in the x-direction, $E_S$ and $\phi_S(Z)$ are respectively the energy and the wave function of a ground state level of electron subbands with respect to a z-direction, and $E_Y$ and $Y(y)$ are respectively the energy and the wave functions of a ground state level of electron subbands with respect to a y-direction.

As shown in the band structures of FIGS. 1B–1D, the wave function of electrons is split in two in a central part, and in the upper QLS 112 (narrow one) the wave function and the energy are as indicated in formulae (3) and (4), respectively, while in the lower QLS 13 (wide one) they are as indicated in formulae (5) and (6), respectively.

$$e^{ik_Nx}\phi_{Na}(z)Y(y) \qquad (3)$$

$$E = (h^2/2m^*)k_N + E_{Na} + E_Y \qquad (4)$$

$$e^{ik_Wx}\phi_{Wa}(z)Y(y) \qquad (5)$$

$$E = (h^2/2m^*)k_W + E_{Wa} + E_Y \qquad (6)$$

In the formulae (3) and (5), normalization constants are omitted, and in those formulae (3)–(6), $E_{Na}$ and $\phi_{Na}(z)$ are respectively the energy and the wave function of a ground state level of electron subbands in the upper QLS 112 with respect to the z-direction, $E_{Wa}$ and $\phi_{Wa}(z)$ are respectively the energy and the wave function of a ground state level of electron subbands in the lower QLS 113 with respect to the z-direction, and $k_N$ and $k_W$ are respectively the angular wave numbers of the motion in the x-direction in upper and lower QLS's 112 and 113.

Since, in general, a relation $E_{Na} \approx E_S$ is satisfied, $k_N \approx k$ is obtained from the formulae (2) and (4), and likewise $k_W \approx k$ is obtained in the lower QLS 113. In this example, however, $k_W = k_N$ is established because this device is formed such that $E_{Na} = E_{Wa}$ is established when no light is applied to the central part (i.e., electrons are branched into the upper and lower QLS's 112 and 113 in an equal ratio).

Here, if light is passed through the central part of this device, the following optical Stark shift occurs.

$$E_{Na} \rightarrow E_{Na} - (e\mu_N\epsilon)^2/\delta_N \qquad (7)$$

$$E_{Wa} \rightarrow E_{Wa} - (e\mu_W\epsilon)^2/\delta_W \qquad (8)$$

where $$\begin{aligned}\hbar\omega &= E_{Nb} - E_{Na} - \delta_N \;(|\delta_N| << \hbar\omega) \\ &= E_{Wb} - E_{Wa} - \delta_W \;(|\delta_W| << \hbar\omega)\end{aligned} \qquad (9)$$

and $E_{Nb}$ and $E_{Wb}$ are respectively energies of the second level in the upper and lower QLS's 112 and 113 with respect to the z-direction and $\mu_N$ and $\mu_W$ are respectively magnitudes of dipoles of a transition from the ground state level to the second level in the upper and lower QLS's 112 and 113.

It is especially effective when the device is designed such that following relation is satisfied (see the band structure in FIG. 1C).

$$E_{Wb} - E_{Wa} < \hbar\omega < E_{Nb} - E_{Na} \qquad (10)$$

Hence, $\delta_N > 0$ and $\delta_W < 0$, so $E_{Na}$ in the upper path 112 shifts to the lower value and $E_{Wa}$ in the lower path 113 shifts to the upper value as is seen in the formulae (7) and (8) (see the hatched arrows in the band structure of FIG. 1C). Then, $k_N$ of the upper path 112 increases while $k_W$ of the lower path 13 decreases, as is known from the formulae (4) and (6).

Thus, if the wave numbers in the upper and lower QLS's 112 and 113 are different, a phase difference between electrons travelling in the upper QLS 112 and electrons travelling in the lower QLS 113 occurs after they have traveled in each path QLS 112 and 113 the same distance in the x-direction. As the part where the light is applied is $0 \leq x \leq L$, the phase difference $\Delta\theta$ is given by $$\Delta\theta = \int_0^L (k_N - k_W)dx. \qquad (11)$$

For instance, if the phase difference $\Delta\theta$ is $\pi$, the form of a combined wave function will become $\phi_A$ that corresponds to the second state, but not $\phi_S$ that corresponds to the first state, of the combined wave, when the wave function of electrons is over again combined at the right side path 111 in FIG. 1A. However, the combined wave has only an energy corresponding to $\phi_S$ but not $\phi_A$, so this is reflected backward. Hence, electrons cannot reach the drain electrode 114 on the right side, so that current would not flow between the source electrode 110 and the drain electrode 114. In fact, as is seen from the formulae (7), (8), (11) and so forth, the phase difference $\Delta\theta$ varies in accordance with the intensity I (associated with $\epsilon^2$) of the light, and the transmittance or transmission coefficient of current to the drain electrode 114 on the right side varies in proportion to $\cos^2(\Delta\theta/2)$. Thus, the current J is given by $$J = J_o \cos^2(\Delta\theta/2) \quad (12)$$

where $J_o$ is a constant.

Therefore, $\Delta\theta$ is obtained from a measured value of J by using the formula (11), and the intensity I of the light is known from the relationship between $\Delta\theta$ and the intensity I, for example, $$\Delta\theta = gI + \Delta\theta_o \quad (13)$$

where g and $\Delta\theta_o$ are constants, respectively.

The above technology is disclosed in the Japanese patent application No. 2-45085 filed by the same assignee.

However, according to the above technology, there may be a problem that an error occurs when the intensity I of light is derived from the current value J. In other words, the measured value of J would fluctuate for the same intensity I of light, each time its value is measured.

This is because the flow of current would fluctuate even if it were highly controlled, due to the collision of electrons at a microscopic level, the capture of electrons to a certain energy level, etc., and because $J_o$ in the formula (12) would waver depending on time. Further, where no current is detected at the side of the drain electrode 114, confirmation could not be made if there really exists no current or no current is detected because electrons have been reflected backward.

In such manner, errors would occur where the phase difference $\Delta\theta$ is estimated from the measured current value J, owing to an uncertainty of $J_o$.

SUMMARY OF THE INVENTION

An object of the present invention is to provide a quantum interference device which is capable of minimizing the above-mentioned errors.

Another object of the present invention is to provide a method for minimizing the abovementioned errors when a quantum interference current is measured or detected.

The invention is directed to processing an interference current by branching an electron wave propagating through quantum-structure paths into plural electron waves confined to the quantum structure paths. The electron waves are combined to produce plural kinds of different energy level electron waves dependent on a phase difference between the branched electron waves. The currents corresponding to the kinds of electron waves are detected and a non-fluctuating current is generated.

According to one aspect of the quantum interference device of the present invention, there are provided a plurality of quantum-structure paths for propagating an electron wave therethrough; means for branching the electron wave into plural electron waves confined in the plurality of quantum-structure paths; means for combining the electron waves to create plural kinds of electron waves having different energy levels and varying in their magnitudes depending on a phase difference between the electron waves; means for measuring currents corresponding to the plural kinds of electron waves, respectively; and means for effecting an operation of non-fluctuation from the currents measured by the measuring means, the non-fluctuation not being influenced by fluctuation of the current corresponding to the electron wave.

According to one aspect of the method for processing an interference current, there are exercised the steps of: branching an electron wave propagating through a plurality of quantum-structure paths into plural electron waves confined in the plurality of quantum-structure paths; combining the electron waves to create plural kinds of electron waves having different energy levels and varying in their magnitudes depending on a phase difference between the branched electron waves; measuring currents of the plural kinds of electron waves, respectively; and performing an operation of a obtaining non-fluctuating current from the currents measured in the measuring step, the non-fluctuating current not being influenced by fluctuation of the current corresponding to the electron wave.

These advantages and others will be more readily understood in connection with the following detailed description, claims and drawings.

BRIEF DESCRIPTION OF THE DRAWINGS

FIG. 2 is a view showing the structure of a first embodiment.

DESCRIPTION OF THE PREFERRED EMBODIMENT

Figure 1A:
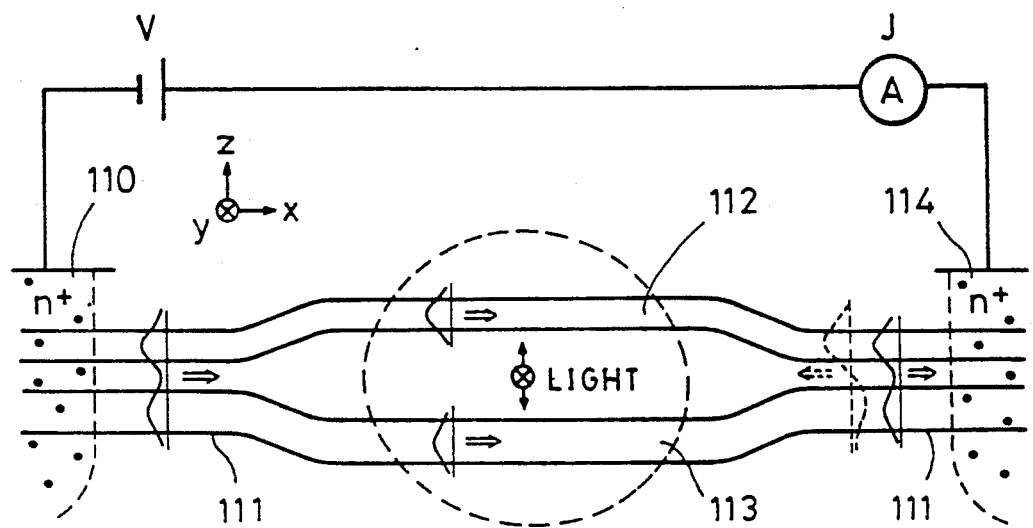
FIG. 1A is a view showing the structure of a related quantum interference device.
Figures 1B, 1C, 1D:
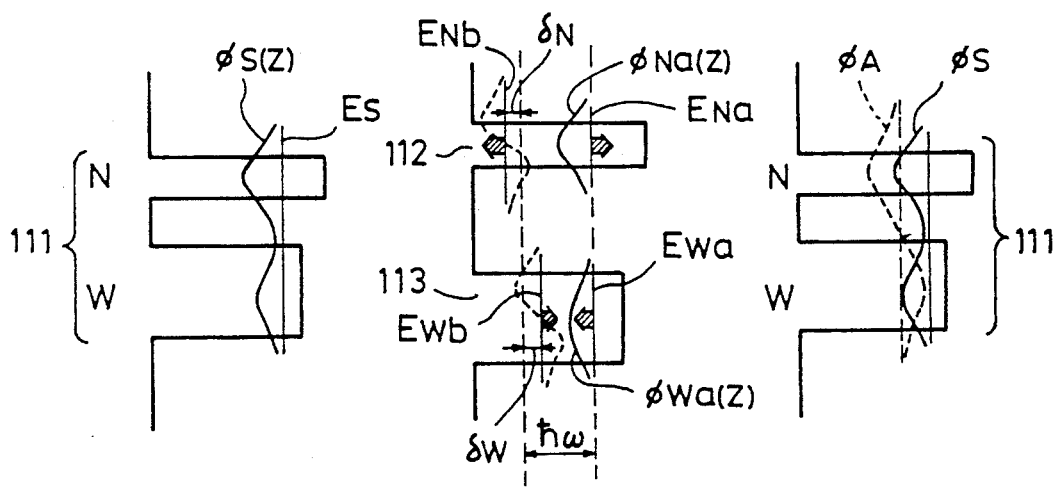
FIGS. 1B–1D are views illustrating band structures and wave functions of respective parts of the device of FIG. 1A.

First, the basic principle of the invention will be explained by use of an example.

By use of the above-mentioned composing or combining means comprising, e.g., a mode converter for electron wave and the measuring means, two kinds of currents $J_+$ and $J_-$ given by the following formulae are measured in place of J of the formula (12), $$J_+ = J_o \cos^2(\Delta\theta/2) \quad (14a)$$

$$J_- = J_o \sin^2(\Delta\theta/2) \quad (14b)$$

Next, from these measured values $J_+$ and $J_-$, the following "normalized current M" is obtained by the calculation or operation in the operating means, such as an operational amplifier, $$M = (J_+ - J_-)/(J_+ J_-) \quad (15)$$

Then, from the formulae (14a), (14b) and (15), the following formula (16) is obtained.

$$M = \cos(\Delta\theta) \quad (16)$$

Therefore, even if $J_o$ fluctuates, this fluctuation of $J_o$ would not influence such a serial estimation process of measured values of $J_+$ and $J_1 \rightarrow$value of M$\rightarrow$value of $\Delta\theta \rightarrow$value of I (see the above formula (13)). As a result, the SN ratio of this device is extremely improved.

FIG. 2 shows a schematic structure of the first embodiment. In FIG. 2, there are provided paths 1, 2 and 3 as electron travelling paths, a barrier layer 4, a source region 5, two drain regions 6 and 6', a mode converter 7, a constant current source 8, ammeters 9 and 9' and an arithmetic device 10. Differences from the structure of FIG. 1A include that the mode converter 7 is added at a portion on the right side of FIG. 2 and that, accompanied therewith, there are provided two ammeters 9 and 9' for respective $J_+$ and $J_-$. In FIG. 2, the driving is done by the constant current source 8, but there is no essential difference even if a constant voltage driving is used as shown in FIG. 1A. However, in the structure of FIG. 2, the resistance to the electron current will be greatly changed depending upon the light irradiation situation of a central zone, so that constant voltage driving is not preferred since the current will vary greatly.

The mode converter 7 is achieved, for example, by a structure in which the QLS's 2 and 3 intersect each other through the thin barrier layer 4 as shown in FIG. 2. Transmittance or a transmission coefficient 50% can be easily attained by adjusting the thickness and composition of the barrier layer 4. In this connection, such technology is described, for example, "Principles of Electron Tunneling Spectroscopy" by E. L. Wolf, Oxford University Press, 1985.

The two ammeters 9 and 9' can be replaced by an operational amplifier or the like.

Figure 3A:
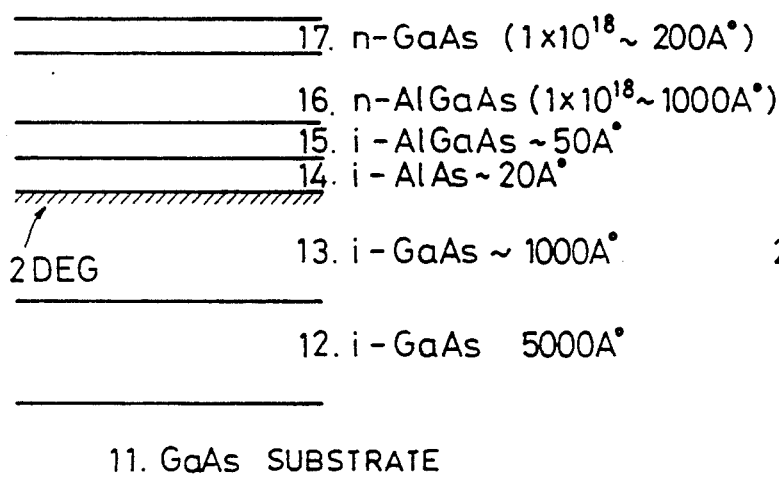
FIG. 3A is a view showing the structure of deposited layers of the first embodiment.
Figure 3B:
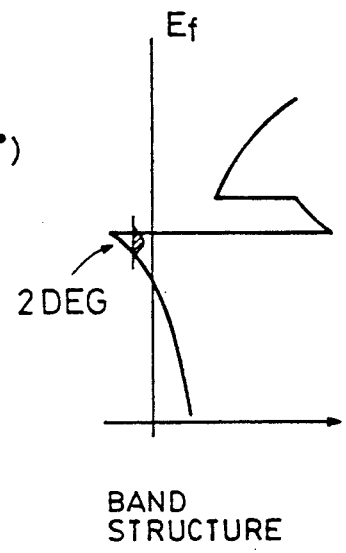
FIG. 3B is a view illustrating the band structure of the first embodiment.

FIG. 3A shows the layered structure of the above embodiment and FIG. 3B illustrates the band structure thereof. In FIG. 3A, on a GaAs substrate 11, an i (intrinsic)—GaAs buffer layer 12 having a thickness of 5000 Å, an i-GaAs layer 13 having a thickness of $\sim$1000 Å, an i-AlAs layer 14 having a thickness of $\sim$20 Å, an i-AlGaAs layer 15 having a thickness of $\sim$50 Å, an n-AlGaAs layer 16 having a thickness of $\sim$1000 Å (dopant concentration: $1 \times 10^{18}$) and an n-GaAs layer 17 having a thickness of $\sim$200 Å (dopant concentration: $1 \times 10^{18}$) may be formed in that order. As is shown in FIG. 3B, a two-dimensional electron gas 2DEG is formed between the i-GaAs layer 13 and the i-AlAs layer 14, and thereby electrons are confined in a direction perpendicular to planes defined by the layers 12-17. In FIG. 3B, $E_f$ indicates the Fermi energy. Further, in FIG. 3A, the i-GaAs layer 13 constitutes a double hetero-structure, but this may be replaced by a quantum well structure and in this case the width of the well is about 100 Å. The i-AlAs layer 14 may be replaced by an i-AlGaAs whose Al fraction is 0.3-0.4, e.g., i-$Al_{0.3}Ga_{0.7}As$.

Figure 4A:
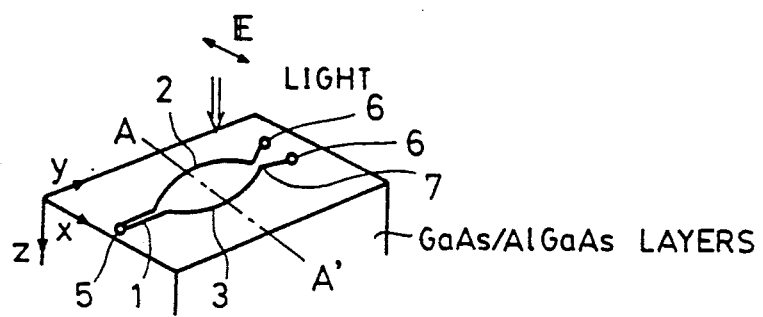
FIG. 4A is a schematic perspective view of the first embodiment.
Figure 4B:
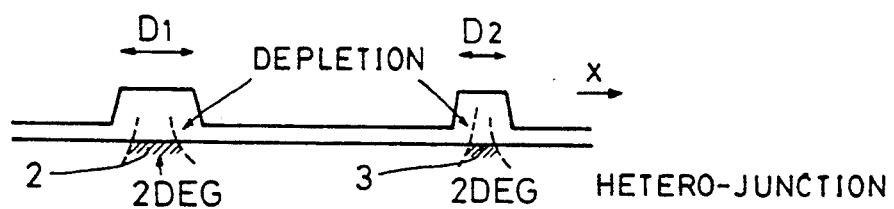
FIG. 4B is a cross-sectional view of FIG. 4A taken along a line A—A'.

The transverse confinement for forming the QLS or electron path is achieved, for example, by a ridge structure formed by, e.g., RIBE (reactive ion beam etching) which is illustrated in FIG. 4B that is an A—A' cross-sectional view of FIG. 4A. FIG. 4A is a schematic perspective view of the device, and as is seen from FIG. 4A, the confinement in the z-direction is attained by the double hetero-structure or quantum well structure while that in the x-direction is attained by the ridge structure of FIG. 4B.

In FIG. 4B, the width of depletion due to the etching is about 1000 Å, though it depends on the amount of dopant. Therefore, when the width $D_1$ of a wider ridge is assumed to be $\sim 0.21$ μm, the electron confinement in the x-direction becomes $\sim 100$ Å. Here, the widths $D_1$ and $D_2$ of the two ridges are made different from each other ($D_1 \approx D_2$) so as to create the phase difference $\Delta\theta$ by the optical Stark effect or optical QCSE (quantum confinement Stark effect) when the light whose electric field vector E oscillates in the x-direction is applied to both of the paths 2 and 3.

In this structure, the barriers at the path 1 and the mode converter 7 are also formed by the depletion due to the etching.

As regards the fabrication of the device, technologies are described, e.g., in "Semiconductors and Semimetals", Vol. 24, Academic Press, Inc. 1987.

The operation of the mode converter 7 of this embodiment is performed in the following manner.

As is shown in FIG. 2, when an electron wave having a wave function of exp($i\theta_N$) $\phi_N$ is injected from the upper QLS 2 and that of exp($i\theta_W$) $\phi_W$ from the lower QLS 3, they are combined or composed and wave functions of $1/\sqrt{2} \cdot (\exp(i\theta_N) + \exp(i\theta_W))\phi_+$ and $1/\sqrt{2} \cdot (\exp(i\theta$ is the same as a case where light is incident on both sides of a half mirror and emitted therefrom.

From the above, $$J_+ \propto |\exp(i\theta_N) + \exp(i\theta_W)|^2 \propto \cos^2(\Delta\theta/2) \text{ and}$$

$$J_- \propto |\exp(i\theta_N) - \exp(i\theta_W)|^2 \propto \sin^2(\Delta\theta/2)$$

are obtained, and they are identical with the above formulae (14a) and (14b). Here, it should be noted that $\Delta\theta = \theta_N - \theta_W$.

In the embodiment shown in FIGS. 3A, 3B, 4A and 4B, an electron wave branching part and a combining part of the electron paths or waveguides are formed by the etching, but they may be formed by the deposition of a linearly-formed double quantum well structure and a plurality of gate electrodes.

Figure 5:
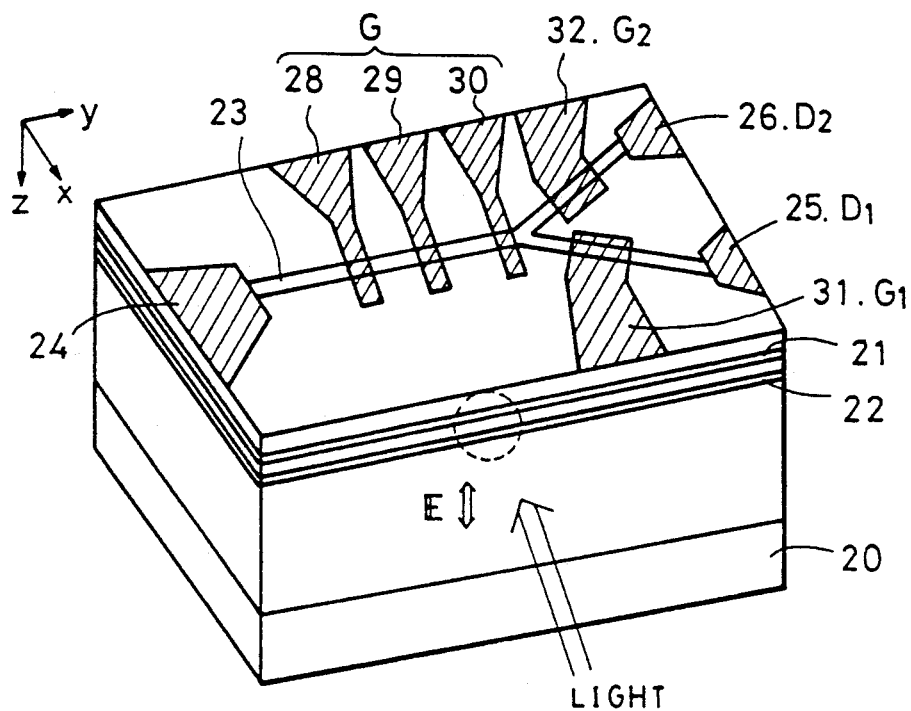
FIG. 5 is a perspective view of a second embodiment of this invention.

In this second embodiment, as shown in FIG. 5, the linearly-formed double quantum well structure (DQWS) including two wells 21 and 22 are formed on a substrate 20. While the electron confinement in the z-direction is achieved by the wells 21 and 22, that in the x-direction is performed by a ridge 23 formed by etching. The ridge 23 is formed in a y-shape between a source 24 and a pair of drains 25 and 26, as shown in FIG. 5. Further, there are formed a plurality of gate electrodes 28, 29, 30, 31 and 32. The first gate 28 operates to branch an electron wave propagated from the source 24 into two electron waves by applying a forward bias voltage. This branching operation is due to the location of the Fermi level above first and second subbands of the DQWS. The second and third gate 29 and 30 also act to maintain the branched state of the electron waves by locating the first and second subbands below the Fermi level. Under the gate electrode 30, however, the first and second subbands approach the Fermi level so as to combine or compose the wave functions of the branched waves. Light whose electric field E oscillates in a direction normal to a plane defined by the layers is directed to this part where the electron is branched into two.

Figure 6:
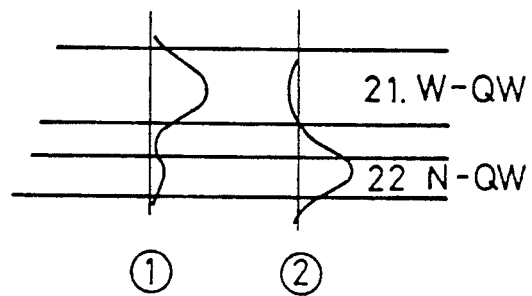
FIG. 6 is a view illustrating wave functions under the gate electrode 30 of the second embodiment.

With respect to the thicknesses of the quantum wells 21 and 22, that of the upper well 21 is relatively wide while that of the lower well 22 is relatively narrow to branch the electron wave in an equal ratio by gate electrodes 28 and 29. Under the last gate 30, the electron wave occupies a bonding state ① with a lower energy or an antibonding state ② with a higher energy depending on the phase difference $\Delta\theta$, as shown in FIG. 6. The offset situations of the wave functions of ① and ② differ depending on the magnitude of the phase difference $2\pi m$ and $(2m+1)\pi$ caused by the light applied to the central part (the optical QCSE).

At the gate 31, a voltage is applied to locate the first state of the wider quantum well 21 lower than that of the narrower quantum well 22, while at the gate 32, a voltage is applied to locate the first state of the narrower quantum well 22 lower than that of the wider quantum well 21. As a result, the drain 25 can detect a component of the phase difference $2m\pi$ and the drain 26 can detect a component of the phase difference $(2m+1)\pi$, because the former electron wave component is re-coupled under the gate 30 and transmitted through the part under the gate 31, while the latter electron wave component is re-coupled under the gate 30 and transmitted through the gate 32.

Figure 7:
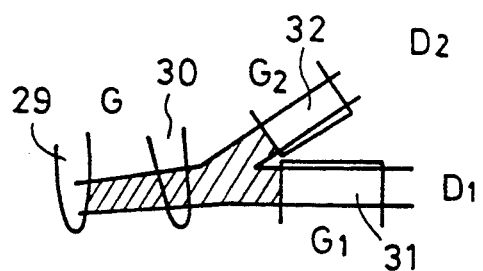
FIG. 7 is a view illustrating a part of the second embodiment.
Figure 8A:
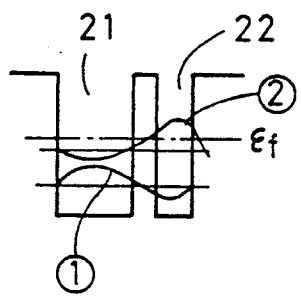
FIG. 8A is a view illustrating the band structure, wave functions and subbands of the hatched portion of FIG. 7.
Figure 8B:
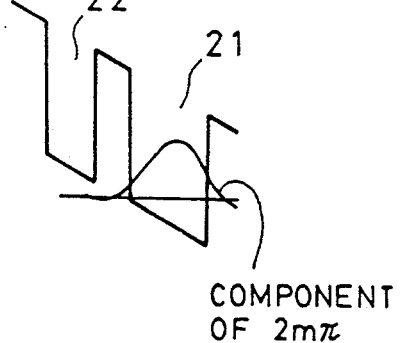
FIGS. 8B and 8C are respectively views illustrating band structures under gate electrodes 31 and 32.
Figure 8C:
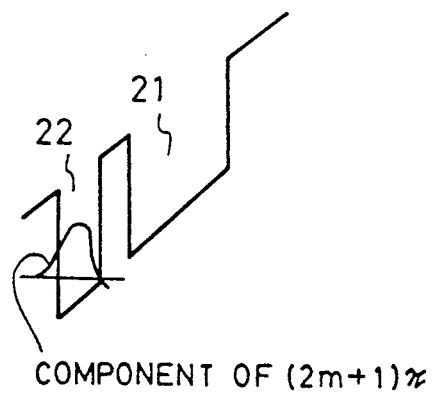

In other words, at a part hatched as shown in FIG. 7, the Fermi energy is located above the level of the antibonding state ② as illustrated in FIG. 8A showing the band structure. And, at the part under the gate 31, a forward bias voltage is applied so that the first state of the wider quantum well 21 becomes lower as shown in FIG. 8B, while at the part under the gate 32, a reverse bias voltage is applied so that the first state of the narrower quantum well 22 becomes lower as shown in FIG. 8C.

The other operation of the second embodiment is the same as that of the first embodiment.

Thus, from two measured currents a combination is calculated, which is not influenced by the fluctuation of electron current (fluctuation of $J_o$), and the intensity of light to be detected is detected with a high SN ratio.

In the above embodiments, photodetectors without photon absorption are adopted as the QID, but devices may be formed as other types of QID. Also in this case, a part where two electron waves with a phase difference are combined is replaced by the mode converter or the like, and downstream thereof, two ammeters and the like are provided.

Further, in the above embodiments, the sum and the difference of the two kinds of currents and a proper combination without any fluctuation is produced, but other processing methods of the two kinds of currents are possible. For instance, such method can be adopted in which the "OR" operation of the two kinds of currents is performed and the "AND" operation of an output of the "OR" operation and one of the two kinds of currents is performed to obtain a combination without any fluctuation.

In the above embodiments, the optical Stark effect is utilized, but other effects can be used, such as the magnetostatic A-B effect and electrostatic A-B effect. In these cases, an input directed to the part where the electron is split into two is not light, but a magnetic flux and an electrostatic potential or gate voltage. For these technologies, reference should be made to another United States patent application filed earlier by the applicants (Serial No. thereof is not yet accorded).

While the voltages applied by the gate electrodes 28 and 29 are kept unchanged in the second embodiment, in the case where the input is the gate voltage, at least one voltage thereof is modulated to modulate the phase difference.

Figure 9:
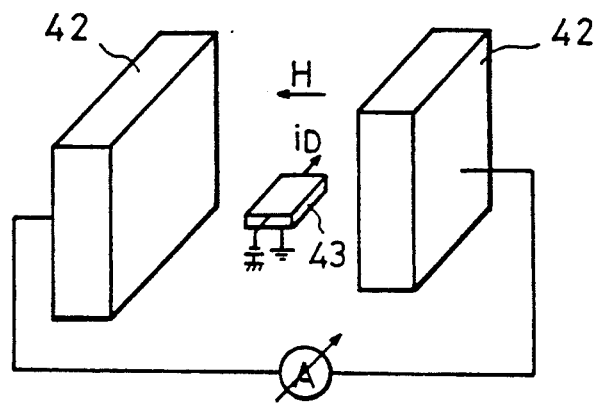
FIG. 9 is a perspective view showing a third embodiment of this invention.

FIG. 9 shows an embodiment in which the gate voltage is kept unchanged and the magnetic field H is varied to modulate the interference current.

In the case, the phase difference between the two electron waves is controlled by applying the magnetic field H across the layers 21 and 22 of a device 43 described above in a direction of an arrow in FIG. 9 by an electromagnet 42. This phase difference $\Delta\theta$ is represented by $$\Delta\theta = 2\pi e/ch \cdot \Phi$$

where $\Phi$ is a magnetic flux passing through a portion of the layers 21 and 22 where the electron wave is branched into two, e is the charge of an electron, c is the velocity of light and h is the Planck constant.

The operation is substantially the same as the above embodiment.

Figure 10:
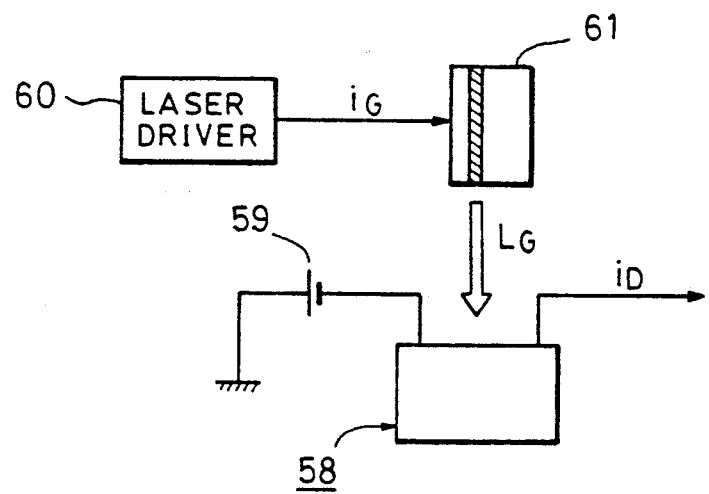
FIG. 10 is a block diagram showing an example in which the quantum interference device of this invention is used as an optical gate transistor.

The above quantum interference devices can be used as high-speed current modulators, and, as an example, FIG. 10 shows a block diagram illustrating an optical gate transistor in which the embodiment of FIG. 2 or FIG. 5 is employed. In FIG. 10, reference numeral 58 is such a device. Between the electrodes of the device 58, a voltage is applied by a power source 59. A gate light $L_G$ is applied from a laser light source 61 such as a semiconductor laser to the device 58. The processed drain current $i_D$ of the device 58 is modulated by modulating the light $L_G$ by a current $i_G$ supplied to the light source 61 from a laser driver 60. When the gate light $L_G$ is a pulse light whose pulse width is below 1 ps, the drain current $i_D$ can be modulated at this rate.

Figure 11:
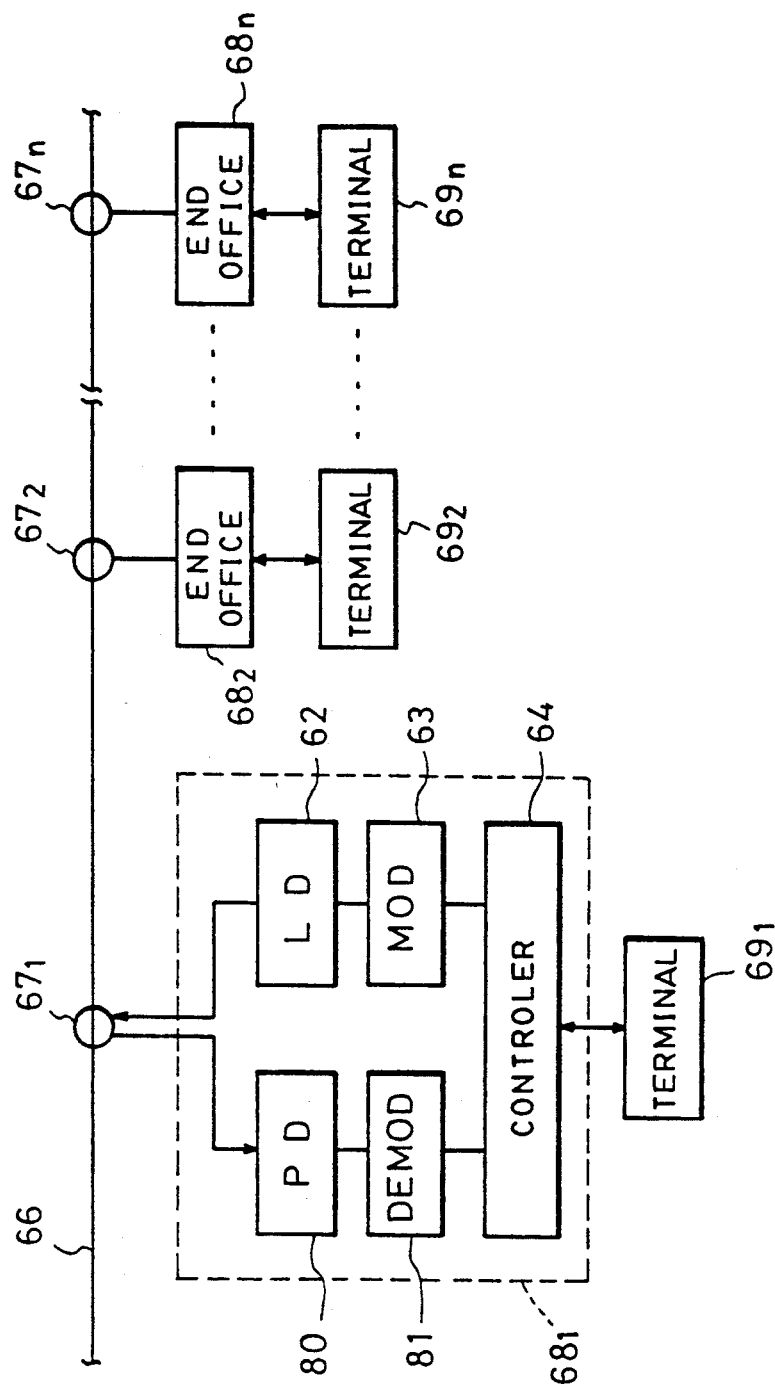
FIG. 11 is a block diagram showing an example of optical communication systems in which the quantum interference device of this invention is used as a photodetector.

FIG. 11 shows a block diagram illustrating an optical communication system in which the embodiment of FIG. 2 or FIG. 5 is used as a photodetector. In FIG. 11, reference numeral 66 is an optical fiber for transmitting light signals. A plurality of end offices $68_1$, $68_2$, ..., $68_n$ are connected to the optical fiber 66 through optical nodes $67_1$, $67_2$, ..., $67_n$, respectively. Terminals $69_1$, $69_2$, ..., $69_n$ are connected to the respective end offices. Each terminal includes a keyboard, a display device, etc.

In each end office, there are provided a light signal transmitter consisting of a laser light source 62 and a modulator 63 and a light signal receiver consisting of a photodetector 80 and a demodulator 81. The transmitter and receiver are controlled by a controller 64 according to instructions from the terminal $69_1$.

While there has been shown and described what are considered preferred embodiments of the present inventions, it will be obvious to those skilled in the art that various changes and modifications may be made therein without departing from the inventions as defined by the claims.

What is claimed is:

1. A quantum interference device comprising:
   a plurality of quantum structure paths for propagating an electron wave therethrough;
   means for branching the electron wave into plural electron waves confined in said plurality of quantum-structure paths;
   means for combining the electron waves to generate plural kinds of electron waves having different energy levels and varying in magnitude depending on a phase difference between the branched electron waves;
   means for detecting currents of said plural kinds of electron waves, respectively; and
   operation means for forming a non-fluctuating current from the detected currents, the non-fluctuating current not being influenced by fluctuations of the current corresponding to the combined electron waves.

2. A quantum interference device according to claim 1 further comprising means for varying a phase difference between the electron waves from said branching means.

3. A quantum interference device according to claim 2 wherein said varying means directs light to said branching means.

4. A quantum interference device according to claim 2, wherein said varying means applies a magnetic field to said branching means.

5. A quantum interference device according to claim 2, wherein said varying means applies an electric field to said branching means.

6. A quantum interference device according to claim 1, wherein said branching means branches the electron wave by increasing a distance separating said paths.

7. A quantum interference device according to claim 1, wherein said paths comprise linearly formed paths and said branching means branches the electron wave by applying a bias voltage.

8. A quantum interference device according to claim 1, wherein said combining means comprise means for forming a sum and difference of the branched electron waves and said operation means comprises means for forming the non-fluctuating current from the sum and the difference.

9. A quantum interference device according to claim 1, wherein said combining means comprises means for forming a bonding state current and an antibonding state current of the branched electron wave and said operation means comprises means for forming the non-fluctuating current from these bonding and antibonding state currents.

10. A quantum interference device according to claim 1, wherein said operation means performs an "OR" operation on the detected current and an "AND" operation on an output of the "OR" operation and one of the detected currents to form the non-fluctuating current.

11. A quantum interference device according to claim 1, wherein said operation means comprises means for forming a quotient between a sum and a difference of the plural kinds of electron waves to form the non-fluctuating current.

12. A method for processing an interference current comprising the steps of:
    branching an electron wave propagating through a plurality of quantum-structure paths into plural electron waves confined in the plurality of quantum-structure paths;
    combining the electron waves to generate plural kinds of electron waves having different energy levels and varying in magnitude depending on a phase difference between the branched electron waves;
    detecting currents of the plural kinds of electron waves, respectively; and
    forming a non-fluctuating current from the detected currents, the non-fluctuating current not being influenced by fluctuations of the current corresponding to the combined electron waves.

13. A method for processing an interference current according to claim 12 further comprising the step of varying a phase difference between the branched electron waves.

14. An optical communication system comprising:
    a plurality of terminals each of which has a light signal transmitter and a light signal receiver; and
    an optical fiber connected to said plurality of terminals for transmitting a light signal,
    wherein the light signal receiver in each of said terminals includes a photodetector for detecting the light signal sent from the other terminals, said photodetector comprising:
    a plurality of quantum-structure paths for propagating an electron wave therethrough;
    means for branching the electron wave into plural electron waves confined in said plurality of quantum-structure paths;
    means for combining the electron waves to generate plural kinds of electron waves having different energy levels and varying in magnitude depending on a phase difference between the branched electron waves;
    means for detecting currents corresponding to said plural kinds of electron waves, respectively;
    operation means for forming a non-fluctuating current from the detected currents, the non-fluctuating current not being influenced by fluctuations of the current corresponding to combined electron waves; and
    means for varying a phase difference between the electron waves from said branching means by directing the light signal to said branching means.

15. An optical communication system according to claim 14, wherein said branching means branches the electron wave by increasing a distance separating said paths.

16. An optical communication system according to claim 14, wherein said paths comprise linearly formed paths and said branching means branches the electron wave by applying a bias voltage.

17. An optical communication system according to claim 14, wherein said combining means comprises means for forming a sum and a difference of the branched electron waves and said operation means comprises means for forming the non-fluctuating current from the sum and the difference.

18. An optical communication system according to claim 14, wherein said combining means comprises means for forming a bonding state current and an antibonding state current of the branched electron waves and said operation means comprises means for forming the non-fluctuating current from these bonding and antibonding state currents.

19. An optical communication system according to claim 14, wherein said operation means performs an "OR" operation on the detected current and an "AND"

operation on an output of the "OR" operation and one of the detected currents to form the non-fluctuating current.

20. An optical communication system according to claim 14, wherein said operation means comprises means for forming a quotient between a sum and a difference of the plural kinds of electron waves to form the non-fluctuating current.

21. A method for producing a quantum interference device, said method comprising the steps of:

forming a plurality of quantum structure paths for propagating an electron wave therethrough;

forming a branching structure for branching the electron wave into plural electron waves confined in said plurality of quantum structure paths;

forming a combining structure for combining the electron waves to generate plural kinds of electron waves having different energy levels and varying in magnitude depending on a phase difference between the branched electron waves, respectively;

forming a detector for detecting currents of said plural kinds of electron waves; and forming an operation circuit for forming a non-fluctuating current from the detected currents, the non-fluctuating current not being influenced by fluctuations of the current corresponding to the combined electron waves.

* * * * *

UNITED STATES PATENT AND TRADEMARK OFFICE
CERTIFICATE OF CORRECTION

PATENT NO. : 5,311,011
DATED : May 10, 1994
INVENTOR(S) : AKIRA SHIMIZU ET AL.

It is certified that error appears in the above-identified patent and that said Letters Patent is hereby corrected as shown below:

COLUMN 1

Form (2), "($h^2$" should read --($h^2$--.
Form (4), "($h^2$" should read --($h^2$--.
Form (6), "($h^2$" should read --($h^2$--.

COLUMN 2

Line 19, "h" (both occurrences) should read --h--.
Line 20, "h" should read --h--.
Line 32, "h" should read --h--.

COLUMN 5

Line 9, "$(J_+J_-)$" should read --$(J_+J_-.)$--.

COLUMN 6

Line 38, "($i\theta is$" should read
  --($i\theta_N$)-exp($i\theta_w$))$\phi$- are emitted. This is--.

COLUMN 8

Line 18, "the" should read --this--.
Line 34, "example." should read --example,--.

UNITED STATES PATENT AND TRADEMARK OFFICE
CERTIFICATE OF CORRECTION

PATENT NO. : 5,311,011
DATED : May 10, 1994
INVENTOR(S) : AKIRA SHIMIZU ET AL.          Page 2 of 2

It is certified that error appears in the above-identified patent and that said Letters Patent is hereby corrected as shown below:

COLUMN 9

Line 21, "1" should read --1,--.
    Line 25, "2" should read --2,--.
    Line 41, "comprise" should read --comprises--.
    Line 49, "wave" should read --waves--.

COLUMN 10

Line 13, "claim 12" should read --claim 12,--.

Signed and Sealed this

Seventh Day of February, 1995

*Attest:*

BRUCE LEHMAN

*Attesting Officer*     *Commissioner of Patents and Trademarks*